(12) United States Patent
Golubovsky et al.

(10) Patent No.: US 11,942,319 B2
(45) Date of Patent: Mar. 26, 2024

(54) PAD CARRIER FOR HORIZONTAL PRE-CLEAN MODULE

(71) Applicant: Applied Materials, Inc., Santa Clara, CA (US)

(72) Inventors: Edward Golubovsky, San Jose, CA (US); Jagan Rangarajan, San Jose, CA (US); Ekaterina Mikhaylichenko, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 311 days.

(21) Appl. No.: 17/511,437

(22) Filed: Oct. 26, 2021

(65) Prior Publication Data

US 2022/0199396 A1 Jun. 23, 2022

Related U.S. Application Data

(60) Provisional application No. 63/127,543, filed on Dec. 18, 2020.

(51) Int. Cl.
*H01L 21/02* (2006.01)
*H01L 21/677* (2006.01)
(Continued)

(52) U.S. Cl.
CPC .. *H01L 21/02057* (2013.01); *H01L 21/67766* (2013.01); *H01L 21/6838* (2013.01); *H01L 21/68764* (2013.01)

(58) Field of Classification Search
CPC ....... B24B 41/047; B24B 37/10; B24B 37/20; B24B 53/017; H01L 21/6838
(Continued)

(56) References Cited

U.S. PATENT DOCUMENTS

| | | | |
|---|---|---|---|
| 5,567,503 A * | 10/1996 | Sexton | B24D 3/30 428/323 |
| 6,523,214 B1 * | 2/2003 | Kaiser | B24B 45/006 451/515 |

(Continued)

FOREIGN PATENT DOCUMENTS

JP 6329813 B2 5/2018

OTHER PUBLICATIONS

International Search Report and Written Opinion dated Feb. 17, 2022 for Application No. PCT/US2021/056678.
(Continued)

*Primary Examiner* — Eric J Rosen
*Assistant Examiner* — Alberto Saenz
(74) *Attorney, Agent, or Firm* — Patterson + Sheridan, LLP

(57) ABSTRACT

A horizontal pre-clean module includes a chamber including a basin and a lid which collectively define a processing area, a rotatable vacuum table disposed in the processing area, a pad conditioning station, a pad carrier positioning arm having a first end and a second end distal from the first end, a pad carrier assembly coupled to the first end of the pad carrier positioning arm, and an actuator coupled to the second end of the pad carrier positioning arm and configured to swing the pad carrier assembly between a first position over the rotatable vacuum table and a second position over the pad conditioning station. The pad carrier assembly includes a gimbal base and a pad carrier coupled to the gimbal base, the gimbal base and the pad carrier are configured to support a buffing pad by a mechanical clamping mechanism and a suction clamping mechanism.

15 Claims, 11 Drawing Sheets

(51) Int. Cl.
  *H01L 21/683* (2006.01)
  *H01L 21/687* (2006.01)
(58) Field of Classification Search
  USPC .................................. 15/97.1; 451/289, 494
  See application file for complete search history.

(56) References Cited

U.S. PATENT DOCUMENTS

| | | |
|---|---|---|
| 2001/0024936 A1 | 9/2001 | Ishikawa et al. |
| 2007/0238399 A1 | 10/2007 | Tolles et al. |
| 2010/0136884 A1* | 6/2010 | Oh .......................... B24B 49/16 |
| | | 451/280 |
| 2012/0276824 A1* | 11/2012 | Marton .................... B24D 7/16 |
| | | 51/293 |
| 2014/0179204 A1* | 6/2014 | Shinozaki ............. B24B 53/017 |
| | | 451/443 |
| 2018/0345452 A1 | 12/2018 | Aizawa et al. |
| 2019/0118338 A1 | 4/2019 | Yamaguchi et al. |

OTHER PUBLICATIONS

U.S. Appl. No. 17/510,111, filed Oct. 25, 2021.
U.S. Appl. No. 29/735,362, filed May 20, 2020.

* cited by examiner

PAD CARRIER FOR HORIZONTAL PRE-CLEAN MODULE

CROSS-REFERENCE TO RELATED APPLICATIONS

This application claims priority to U.S. Provisional Patent Application Ser. No. 63/127,543, filed on Dec. 18, 2020, which is incorporated by reference herein.

BACKGROUND

Field

Embodiments described herein generally relate to equipment used in the manufacturing of electronic devices, and more particularly, to a horizontal pre-clean (HPC) module which may be used to clean the surface of a substrate in a semiconductor device manufacturing process.

Description of the Related Art

Chemical mechanical polishing (CMP) is commonly used in the manufacturing of high-density integrated circuits to planarize or polish a layer of material deposited on a substrate. In a horizontal pre-clean (HPC) module used in a CMP process, a rotating buffing pad is pressed against a material layer on a surface of the substrate, and material is removed across the material layer through a combination of chemical and mechanical activity provided by a polishing fluid and relative motion of the buffing bad and the substrate. As compared with a conventional buffing pad formed of material, such as poromeric material or filled or unfilled polymer material, a buffing pad formed of polyvinyl alcohol (PVA) material provides high shear force for chemical and mechanical polishing due to mechanical strength and abrasion resistance. PVA material is water absorbent, soft, and elastic, in addition to being inherently thicker and larger than the conventional material. Furthermore, a larger buffing pad improves performance and reduces buffing time in chemical mechanical cleaning. However, a buffing pad formed of PVA material may sag when supported by a pad carrier due to the inherently thicker and larger size.

Therefore, there is a need for systems and methods for supporting a large and thick water absorbent buffing pad while preventing the buffing pad from sagging.

SUMMARY

Embodiments of the present disclosure provide a horizontal pre-clean module. The horizontal pre-clean module includes a chamber including a basin and a lid which collectively define a processing area, a rotatable vacuum table disposed in the processing area, the rotatable vacuum table including a substrate receiving surface, a pad conditioning station disposed proximate to the rotatable vacuum table, a pad carrier positioning arm having a first end and a second end distal from the first end, a pad carrier assembly coupled to the first end of the pad carrier positioning arm, and an actuator coupled to the second end of the pad carrier positioning arm and configured to swing the pad carrier assembly between a first position over the rotatable vacuum table and a second position over the pad conditioning station. The pad carrier assembly includes a gimbal base and a pad carrier coupled to the gimbal base, the gimbal base and the pad carrier are configured to support a buffing pad by a mechanical clamping mechanism and a suction clamping mechanism.

Embodiments of the present disclosure also provide a pad carrier assembly for use in a horizontal pre-clean module. A pad carrier assembly includes a gimbal base, and a pad carrier coupled to the gimbal base. The gimbal base and the pad carrier are configured to support a buffing pad by a mechanical clamping mechanism and a suction clamping mechanism.

Embodiments of the present disclosure further provide a method of supporting a buffing pad in a horizontal pre-clean module. The method includes mechanically clamping a buffing pad on a peripheral edge of the buffing pad by a lip portion of a gimbal base and a tapered portion of a pad carrier, wherein the gimbal base and the pad carrier are coupled and disposed in a horizontal pre-clean module, and supporting the buffing pad and preventing the buffing pad from sagging, by a suction clamping mechanism.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein generally relate to equipment used in the manufacturing of electronic devices, and more particularly, to a horizontal pre-clean (HPC) module which may be used to clean the surface of a substrate in a semiconductor device manufacturing process.

A buffing pad formed of polyvinyl alcohol (PVA) material provides high shear force for chemical and mechanical polishing due to mechanical strength and abrasion resistance. However, PVA material is water absorbent, soft, and elastic, in addition to being inherently thicker and larger than the conventional material, and thus a buffing pad formed of PVA material may sag when supported by a pad carrier.

In the embodiments described herein, pad carriers support a large and thick water absorbent buffing pad while preventing the buffing pad from sagging by a mechanical clamping mechanism and a suction clamping mechanism during chemical mechanical cleaning.

Figure 1A:
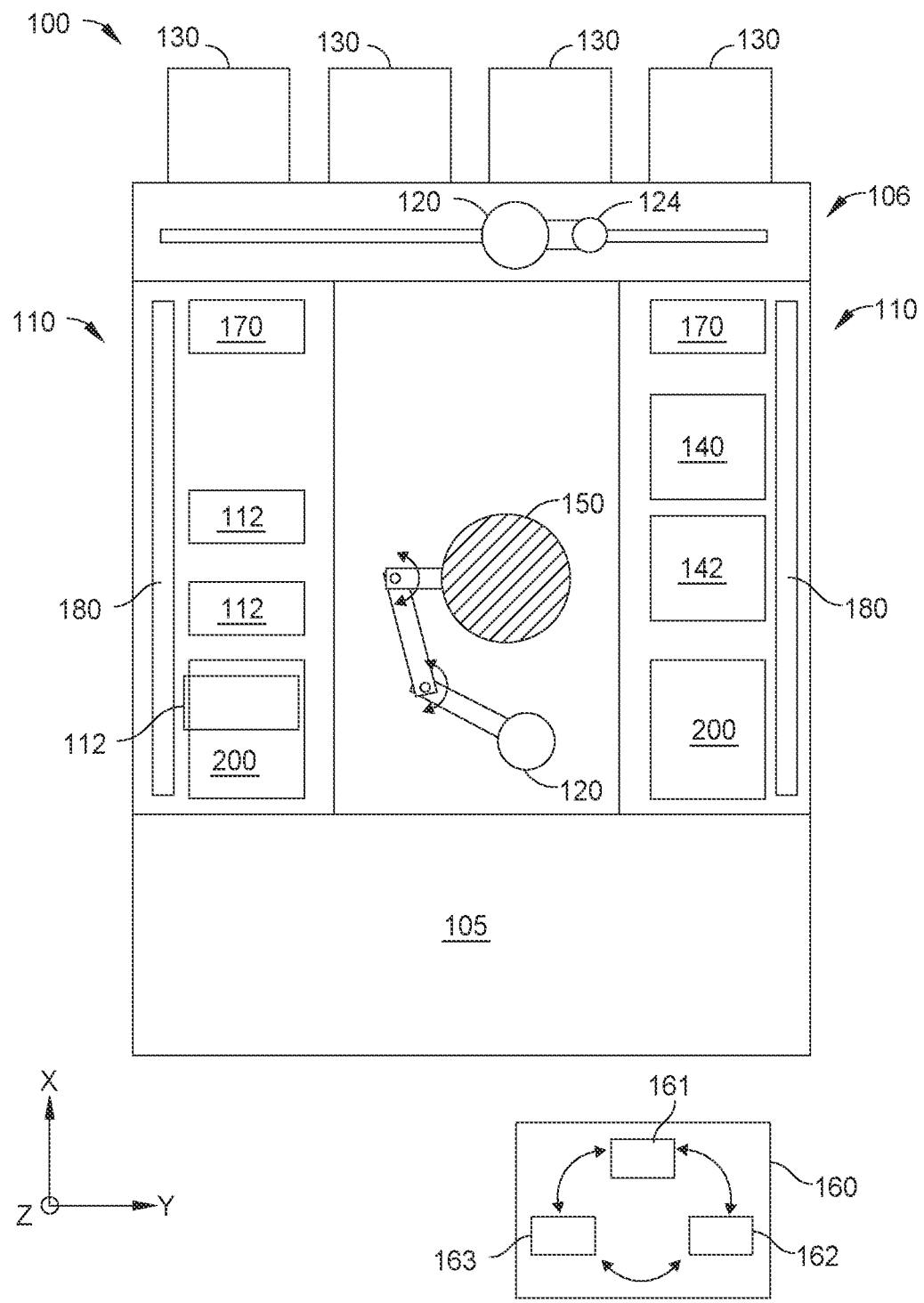
FIG. 1A is a schematic plan view of an exemplary chemical mechanical polishing (CMP) processing system, which uses a horizontal pre-clean (HPC) module described herein, according to one or more embodiments.
Figure 1B:
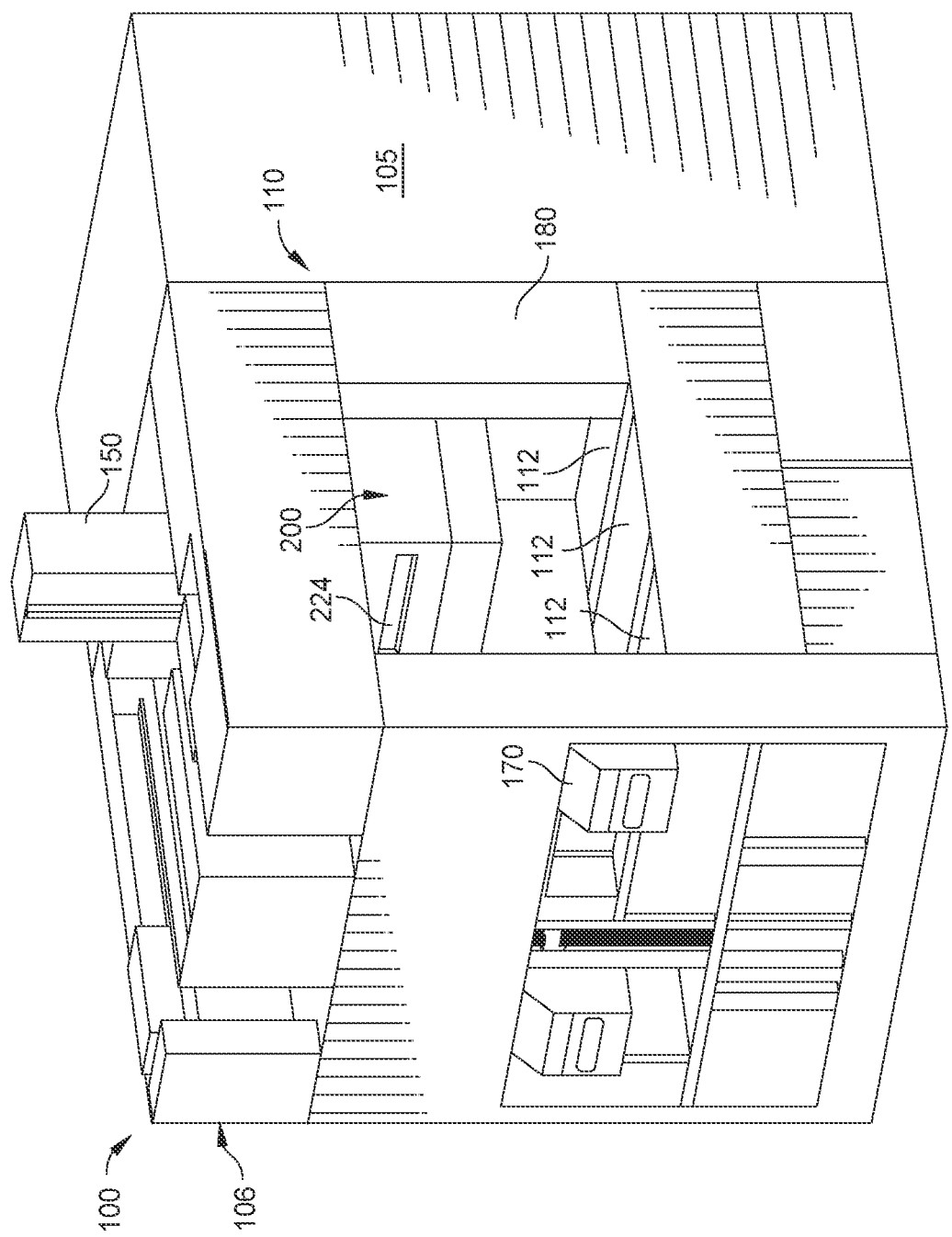
FIG. 1B is a top isometric view of an exemplary CMP processing system, which may correspond to the schematic view shown in FIG. 1A, according to one or more embodiments.
Figure 1C:
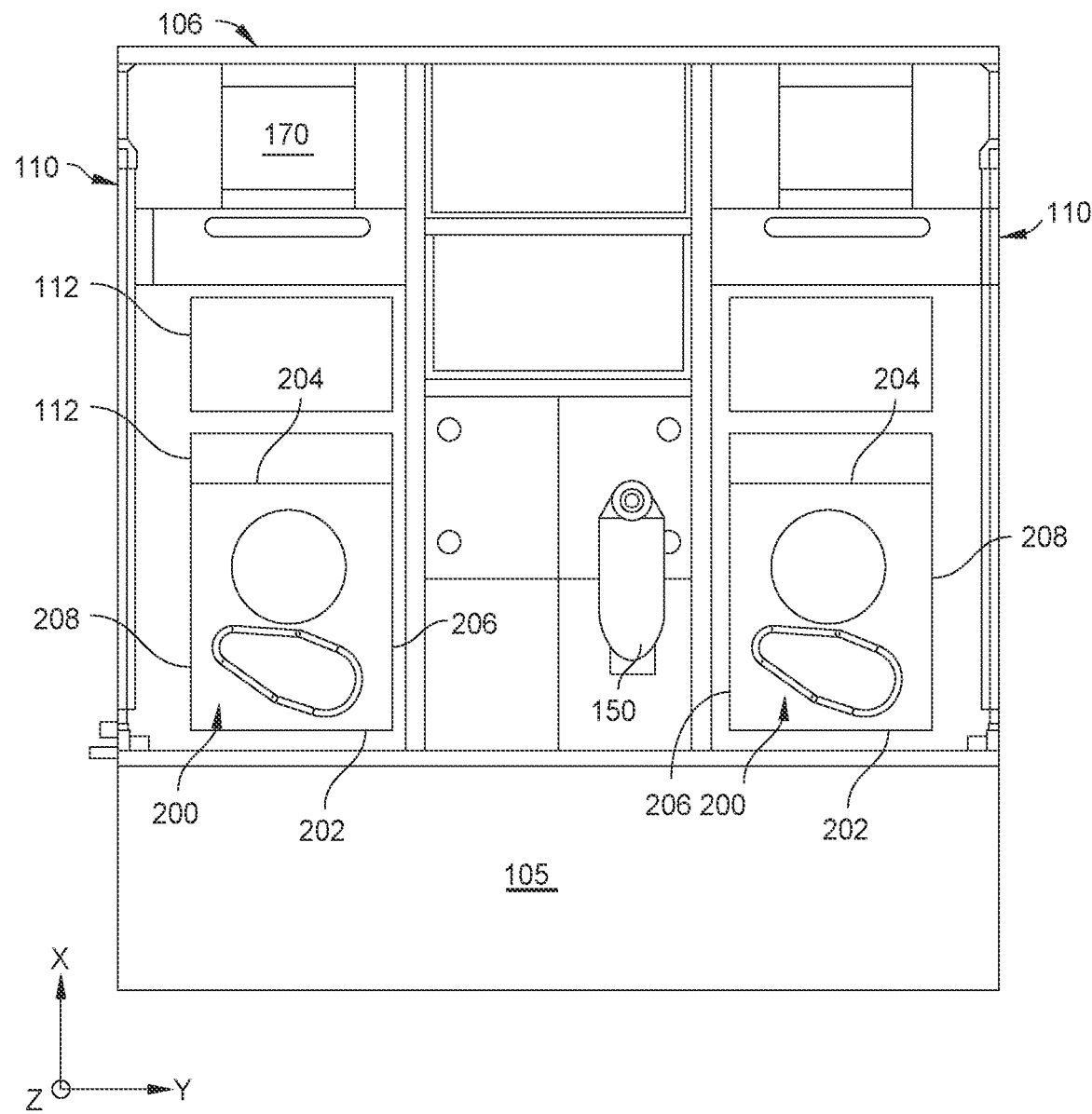
FIG. 1C is a top elevation view of the CMP processing system of FIG. 1B, which may correspond to the schematic view shown in FIG. 1A, according to one or more embodiments.

FIG. 1A is a schematic plan view of an exemplary chemical mechanical polishing (CMP) processing system 100, which uses a horizontal pre-clean (HPC) module described herein, according to one or more embodiments. FIG. 1B is a top isometric view of an exemplary CMP processing system 100 which may correspond to the schematic view shown in FIG. 1A, according to one or more embodiments. FIG. 1C is a top elevation view of the CMP processing system 100 of FIG. 1B which may correspond to the schematic view shown in FIG. 1A, according to one or more embodiments. In FIGS. 1B and 1C, certain parts of the housing and certain other internal and external components are omitted to more clearly show the HPC module within the CMP processing system 100. Here, the CMP processing system 100 includes a first portion 105 and a second portion 106 coupled to the first portion 105 and integrated therewith. The first portion 105 is a substrate polishing portion featuring a plurality of polishing stations (not shown).

The second portion 106 includes one or more post-CMP cleaning systems 110, a plurality of system loading stations 130, one or more substrate handlers, e.g., a first robot 124 and a second robot 150, one or more metrology stations 140, one or more location specific polishing (LSP) modules 142, one or more HPC modules 200, and one or more drying units 170. The HPC module 200 is configured to process a substrate 120 disposed in a substantially horizontal orientation (i.e., in the x-y plane). In some embodiments, the second portion 106 optionally includes one or more vertical cleaning modules 112 configured to process substrates 120 disposed in substantially vertical orientations (i.e., in the z-y plane).

Each LSP module 142 is typically configured to polish only a portion of a substrate surface using a polishing member (not shown) that has a surface area that is less than the surface area of a to-be polished substrate 120. LSP modules 142 are often used after the substrate 120 has been polished with a polishing module to touch up, e.g., remove additional material, from a relatively small portion of the substrate.

The metrology station 140 is used to measure the thickness of a material layer disposed on the substrate 120 before and/or after polishing, to inspect the substrate 120 after polishing to determine if a material layer has been cleared from the field surface thereof, and/or to inspect the substrate surface for defects before and/or after polishing. In those embodiments, the substrate 120 may be returned to the polishing pad for further polishing and/or directed to a different substrate processing module or station, such as a polishing module within the first portion 105 or to an LSP module 142 based on the measurement or surface inspection results obtained using the metrology station 140. As shown in FIG. 1A, a metrology station 140 and an LSP module 142 are located in a region of the second portion 106 that is above (in the Z-direction) portions of one of the post-CMP cleaning systems 110.

The first robot 124 is positioned to transfer substrates 120 to and from the plurality of system loading stations 130, e.g., between the plurality of system loading stations 130 and the second robot 150 and/or between the post-CMP cleaning system 110 and the plurality of system loading stations 130. In some embodiments, the first robot 124 is positioned to transfer the substrate 120 between any of the system loading stations 130 and a processing system positioned proximate thereto. For example, in some embodiments, the first robot 124 may be used to transfer the substrate 120 between one of the system loading stations 130 and the metrology station 140.

The second robot 150 is used to transfer the substrate 120 between the first portion 105 and the second portion 106. For example, here the second robot 150 is positioned to transfer a to-be-polished substrate 120 received from the first robot 124 to the first portion 105 for polishing therein. The second robot 150 is then used to transfer the polished substrate 120 from the first portion 105, e.g., from a transfer station (not shown) within the first portion 105, to one of the HPC modules 200 and/or between different stations and modules located within the second portion 106. Alternatively, the second robot 150 transfers the substrate 120 from the transfer station within the first portion 105 to one of the LSP modules 142 or the metrology station 140. The second robot 150 may also transfer the substrate 120 from either of the LSP modules 142 or the metrology station 140 to the first portion 105 for further polishing therein.

The CMP processing system 100 in FIG. 1A features two post-CMP cleaning systems 110 disposed on either side of the second robot 150. In FIG. 1A at least some modules of one of the post-CMP cleaning systems 110, e.g., one or more vertical cleaning modules 112, are located below (in the Z-direction) the metrology station 140 and the LSP module 142 and are thus not shown. The metrology station 140 and the LSP module 142 are not shown in FIG. 1C. In some other embodiments, the CMP processing system 100 features only one post-CMP cleaning system 110. Here, each of the post-CMP cleaning systems 110 includes an HPC module 200, one or more vertical cleaning modules 112, e.g., brush or spray boxes, a drying unit 170, and a substrate handler 180 for transferring substrates 120 therebetween. Here, each HPC module 200 is disposed within the second portion 106 in a location proximate to the first portion 105.

Typically, the HPC module 200 receives a polished substrate 120 from the second robot 150 through a first opening (not shown) formed in a side panel of the HPC module 200, e.g., though a door or a slit valve disposed in the side panel. The substrate 120 is received in a horizontal orientation by the HPC module 200 for positioning on a horizontally disposed substrate support surface therein. The HPC module 200 then performs a pre-clean process, such as a buffing process, on the substrate 120 before the substrate 120 is transferred therefrom using a substrate handler 180.

The substrate 120 is transferred from the HPC module 200 through a second opening, here an opening 224 (FIG. 1B), which is typically a horizontal slot disposed though a second side panel of the HPC module 200 closeable with a door, e.g., a slit valve. Thus, the substrate 120 is still in a horizontal orientation as it is transferred from the HPC module 200. After the substrate 120 is transferred from the HPC module 200, the substrate handler 180 swings the substrate 120 to a vertical position for further processing in the vertical cleaning modules 112 of the post-CMP cleaning system 110.

In this example, the HPC module 200 has a first end 202 facing the first portion 105 of the CMP processing system 100, a second end 204 facing opposite the first end 202, a first side 206 facing the second robot 150, and a second side 208 facing opposite the first side 206. The first and second sides 206, 208 extend orthogonally between the first and second ends 202, 204.

The plurality of vertical cleaning modules 112 are located within the second portion 106. The one or more vertical cleaning modules 112 are any one or combination of contact and non-contact cleaning systems for removing polishing byproducts from the surfaces of a substrate, e.g., spray boxes and/or brush boxes.

The drying unit 170 is used to dry the substrate 120 after the substrate has been processed by the vertical cleaning modules 112 and before the substrate 120 is transferred to a system loading station 130 by the first robot 124. Here, the drying unit 170 is a horizontal drying unit, such that the drying unit 170 is configured to receive a substrate 120 through an opening (not shown) while the substrate 120 is disposed in a horizontal orientation.

Herein, substrates 120 are moved between the HPC module 200 and the vertical cleaning modules 112, between individual ones of the vertical cleaning modules 112, and between the vertical cleaning modules 112 and the drying unit 170 using the substrate handler 180.

In embodiments herein, operation of the CMP processing system 100, including the substrate handler 180, is directed by a system controller 160. The system controller 160 includes a programmable central processing unit (CPU) 161 which is operable with a memory 162 (e.g., non-volatile memory) and support circuits 163. The support circuits 163 are conventionally coupled to the CPU 161 and comprise cache, clock circuits, input/output subsystems, power supplies, and the like, and combinations thereof coupled to the various components of the CMP processing system 100, to facilitate control thereof. The CPU 161 is one of any form of general purpose computer processor used in an industrial setting, such as a programmable logic controller (PLC), for controlling various components and sub-processors of the processing system. The memory 162, coupled to the CPU 161, is non-transitory and is typically one or more of readily available memories such as random access memory (RAM), read only memory (ROM), floppy disk drive, hard disk, or any other form of digital storage, local or remote.

Typically, the memory 162 is in the form of a non-transitory computer-readable storage media containing instructions (e.g., non-volatile memory), which when executed by the CPU 161, facilitates the operation of the CMP processing system 100. The instructions in the memory 162 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative non-transitory computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory devices, e.g., solid state drives (SSD)) on which information may be permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods set forth herein, or portions thereof, are performed by one or more application specific integrated circuits (ASICs), field-programmable gate arrays (FPGAs), or other types of hardware implementations. In some other embodiments, the substrate processing and/or handling methods set forth herein are performed by a combination of software routines, ASIC(s), FPGAs and, or, other types of hardware implementations. One or more system controllers 160 may be used with one or any combination of the various modular polishing systems described herein and/or with the individual polishing modules thereof.

Figure 2A:
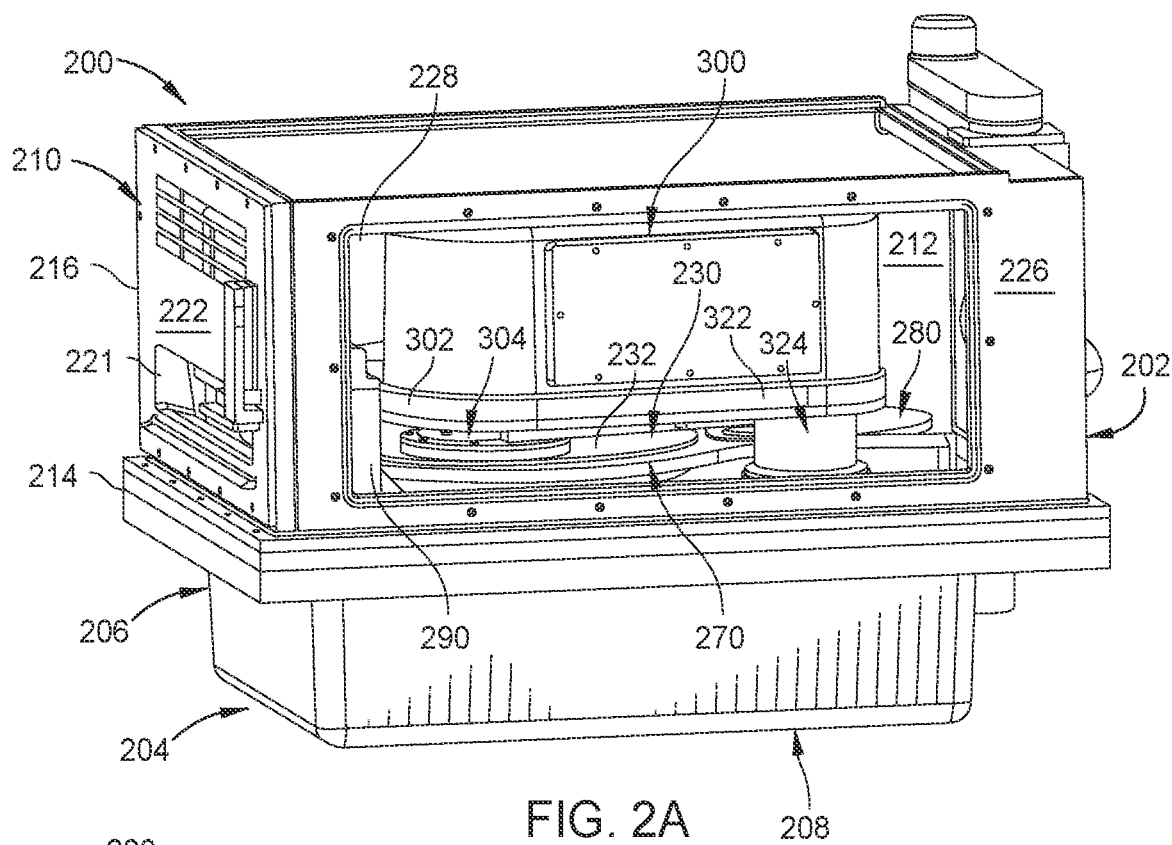
FIG. 2A is a top isometric view of one side of an exemplary HPC module according to one or more embodiments.
Figure 2B:
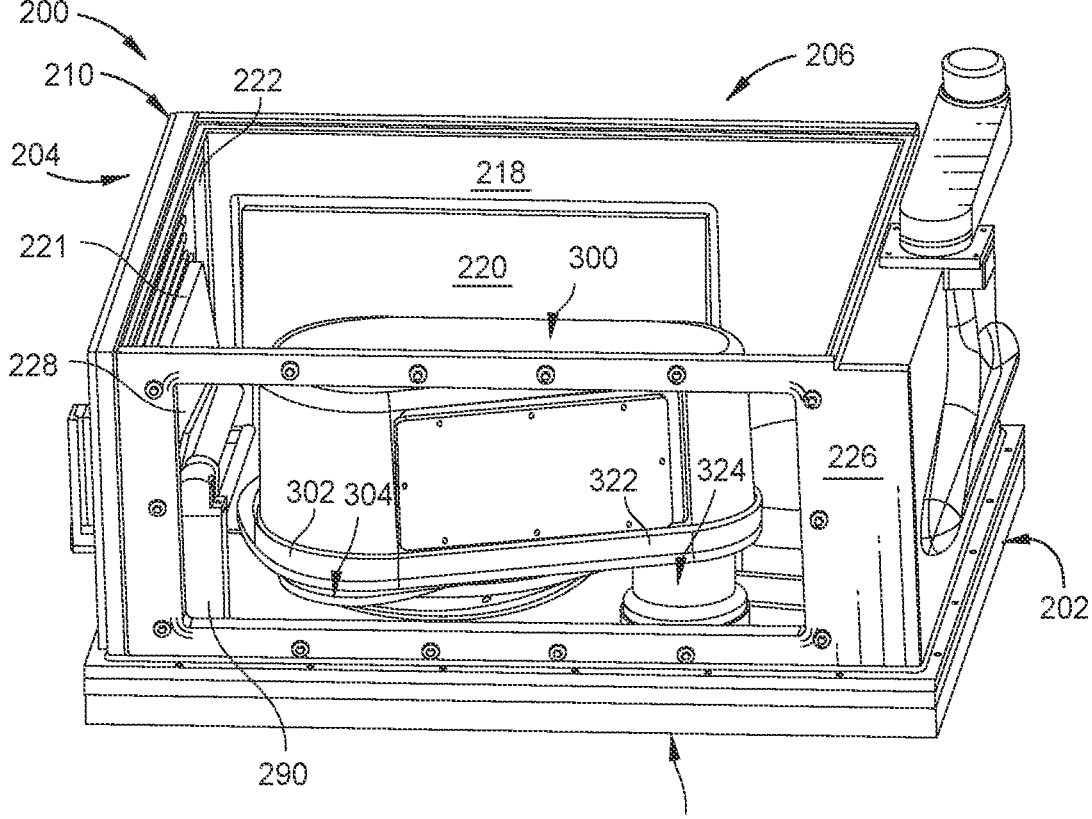
FIG. 2B is another top isometric view of the side of the HPC module of FIG. 2A.
Figure 2C:
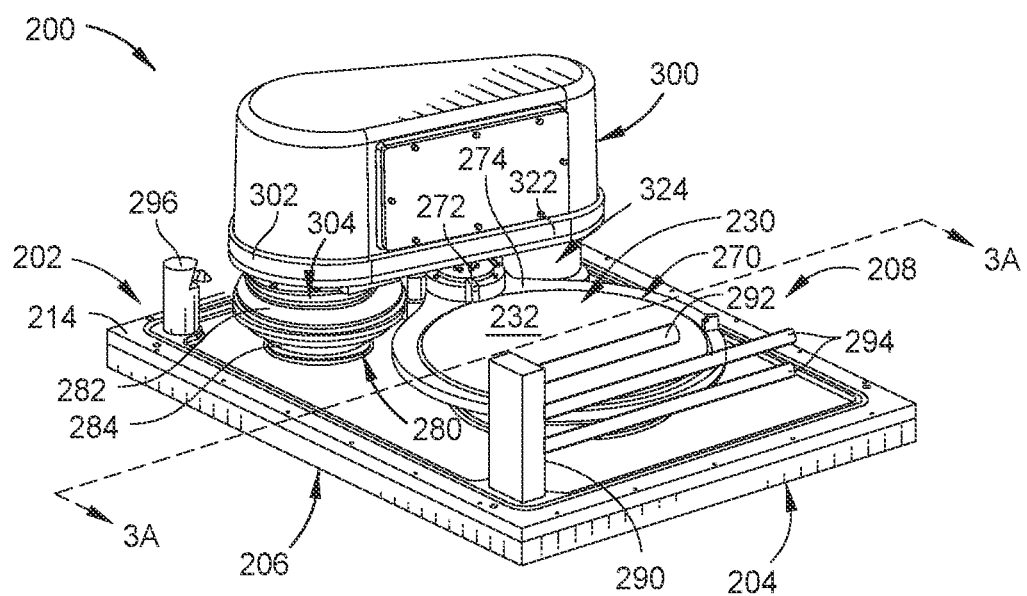
FIG. 2C is a top isometric view of another side of the HPC module of FIG. 2A.

FIG. 2A is a top isometric view of the second side 208 of an exemplary HPC module 200 which may be used in the CMP processing system 100 described herein. In FIG. 2A, a service access panel is omitted to more clearly show the internal components of the HPC module 200. FIG. 2B is another top isometric view of the second side 208 of the HPC module 200 of FIG. 2A. In FIG. 2B, a top panel of a lid 216 is further omitted to more clearly show the internal components of the HPC module 200. FIG. 2C is a top isometric view of the first side 206 of the HPC module 200 of FIG. 2A. In FIG. 2C, the lid 216 is omitted to more clearly show the internal components of the HPC module 200.

Generally, the HPC module 200 includes a chamber 210, a basin 214, and a lid 216, formed of a plurality of side panels which collectively define a processing area 212.

A first side panel 218 is formed on the first side 206 of the HPC module 200 facing the second robot 150. The first side panel 218 includes a first substrate handler access door 220 used for positioning a substrate 120 on a rotatable vacuum table 230 with the second robot 150. A second side panel 222 is formed on the second end 204 of the HPC module 200 facing away from the first portion 105. The second side panel 222 includes a second substrate handler access door 221 used for removing the substrate 120 from the rotatable vacuum table 230 with the substrate handler 180. A third side panel 226 is formed on the second side 208 of the HPC module 200. The third side panel 226 includes a service access panel opening 228. The symmetry of the first substrate handler access door 220 and the service access panel opening 228 formed on opposite side panels of the HPC module 200 beneficially provides a horizontal buffing module that can be installed on either side of the processing system 100 as illustrated in FIG. 1C.

Disposed within the processing area 212, the HPC module 200 further includes the rotatable vacuum table 230 for vacuum chucking a substrate 120, an annular substrate lift mechanism 270 disposed radially outward of the rotatable vacuum table 230, a pad conditioning station 280 disposed proximate the rotatable vacuum table 230, and a pad carrier positioning arm 300 movable between a first position over the rotatable vacuum table 230 and a second position over the pad conditioning station 280.

The rotatable vacuum table 230, the annular substrate lift mechanism 270, the pad conditioning station 280, and the pad carrier positioning arm 300 are each independently mounted to the basin 214. The HPC module 200 further includes a rinse manifold 290 mounted to the basin 214. A substrate center rinse bar 292 and one or more substrate spray bars 294 extend from a side of the rinse manifold 290. The substrate center rinse bar 292 is used for directing a rinse fluid, e.g., a cleaning fluid or water, towards a center area of the rotatable vacuum table 230. The substrate spray bars 294 are used for directing a spray towards one or more other areas of the rotatable vacuum table 230, e.g., a perimeter area or a side portion of the rotatable vacuum table 230. The rinse manifold 290 is positioned towards a corner of the basin 214, and the substrate center rinse bar 292 and the substrate spray bars 294 extend along the second end 204 of the HPC module 200 inside the second side panel 222. In some embodiments, the rinse manifold 290 is adjacent to the second side 208 (FIGS. 2A-2B). In some other embodiments, the rinse manifold 290 is adjacent to the first side 206 (FIG. 2C). The HPC module 200 further includes a brush rinse 296 mounted to the basin 214. The brush rinse 296 is positioned towards the first end 202 of the HPC module 200 and adjacent to the pad conditioning station 280 for rinsing one or more components of the pad conditioning station 280.

Figure 3A:
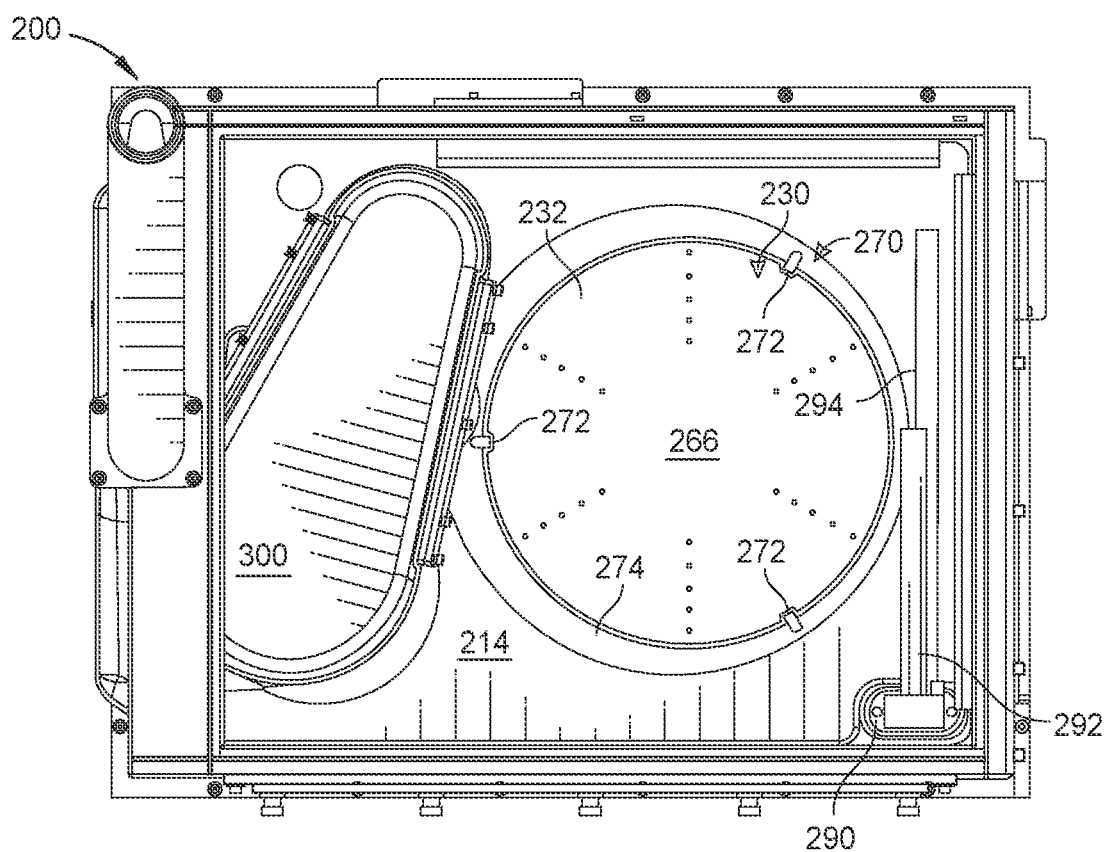
FIG. 3A is a plan view of an exemplary HPC module according to one or more embodiments.

FIG. 3A is a plan view of the HPC module 200 of FIG. 2C. The annular substrate lift mechanism 270 is disposed radially outward of the rotatable vacuum table 230. The lift mechanism 270 includes a plurality of substrate contact points 272 disposed proximate to a circumferential edge of the rotatable vacuum table 230. Each of the substrate contact points 272 is an upward facing shoulder formed on a substrate hoop 274 surrounding a chuck plate 232. The lift mechanism 270 is configured so that one of the plurality of substrate contact points 272 contacts a substrate 120 before other ones of the plurality of substrate contact points 272 when lifting the substrate 120 from a substrate receiving surface 266 of the rotatable vacuum table 230. The annular substrate lift mechanism 270 works in conjunction with the venting of vacuum pressure and optional nitrogen purge, described earlier, to remove the substrate 120 from the chuck plate 232. Beneficially, use of the substrate lift mechanism 270 enables faster dechucking of the substrate 120 relative to the venting and optional nitrogen purge alone.

Figure 3B:
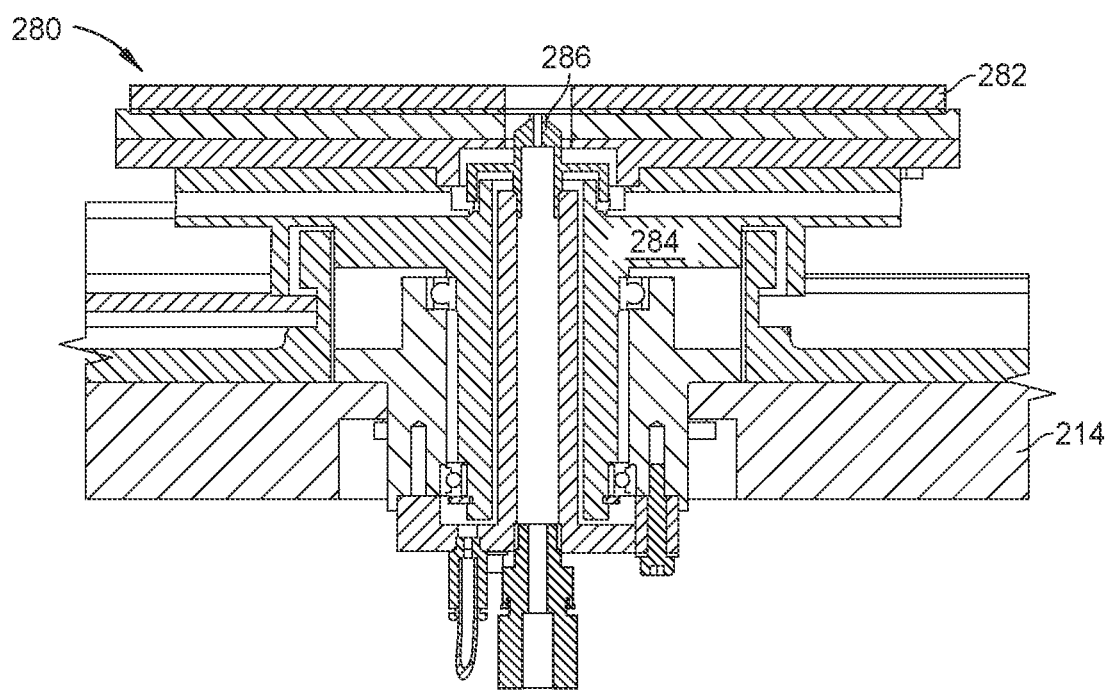
FIG. 3B is a side sectional view of an exemplary pad conditioning station according to one or more embodiments.

FIG. 3B is a side sectional view of an exemplary pad conditioning station 280 which may be used in the HPC module 200 of FIG. 3A. The pad conditioning station 280 is disposed proximate to the rotatable vacuum table 230. The pad conditioning station 280 includes a conditioning brush 282 facing away from the basin 214. In some embodiments, the conditioning brush 282 includes a fibrous material. In some embodiments, the fibers are formed from nylon or another similar material. The conditioning brush 282 is coupled to a rotatable brush shaft 284. The brush shaft 284 extends through the basin 214 being fluidly coupled to a conditioning fluid source (not shown). The brush shaft 284 is configured to convey conditioning fluid, e.g., deionized water, to a spray nozzle 286 disposed proximate the conditioning brush 282. During operation of the pad conditioning station 280, the conditioning brush 282 is rotated by the brush shaft 284. During rotation, the conditioning fluid flows through the brush shaft 284 to the spray nozzle 286, thereby wetting the conditioning brush 282 and facilitating the conditioning process.

Figure 3C:
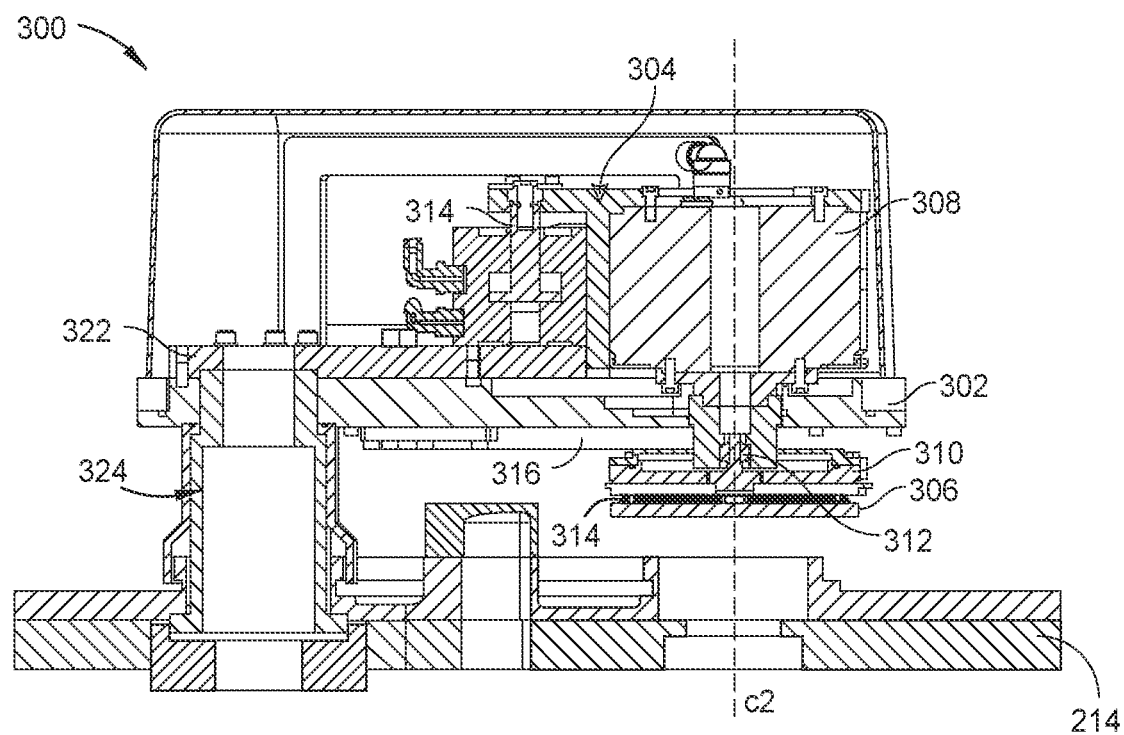
FIG. 3C is a side sectional view of an exemplary pad carrier positioning arm according to one or more embodiments.

FIG. 3C is a side sectional view of an exemplary pad carrier positioning arm 300 which may be used in the HPC module 200 of FIG. 3A. The pad carrier positioning arm 300 is disposed proximate to the rotatable vacuum table 230 and the pad conditioning station 280. A distal end 302 of the pad carrier positioning arm 300 includes a vertically movable pad carrier assembly 304 for supporting a buffing pad 306 at a lower end thereof. The pad carrier assembly 304 includes a head motor 308 for rotating the buffing pad 306 about an axis c2 which is substantially aligned in the direction of gravity. The pad carrier assembly 304 includes a gimbal base 310 coupled to the head motor 308 by a spherical bearing 312 allowing a buffing surface of the pad carrier assembly 304 to pivot relative to a plane orthogonal to the axis c2. The pad carrier assembly 304 further includes a pad carrier 314 coupled to the gimbal base 310. In some embodiments, the pad carrier 314 is sized to support a buffing pad 306 having a diameter of about 134 mm that is larger than conventional buffing pads used in pre-clean modules. In some embodiments, the pad carrier positioning arm 300 of the present disclosure supports a larger buffing pad 306 compared to conventional pre-clean modules.

Figure 4A:
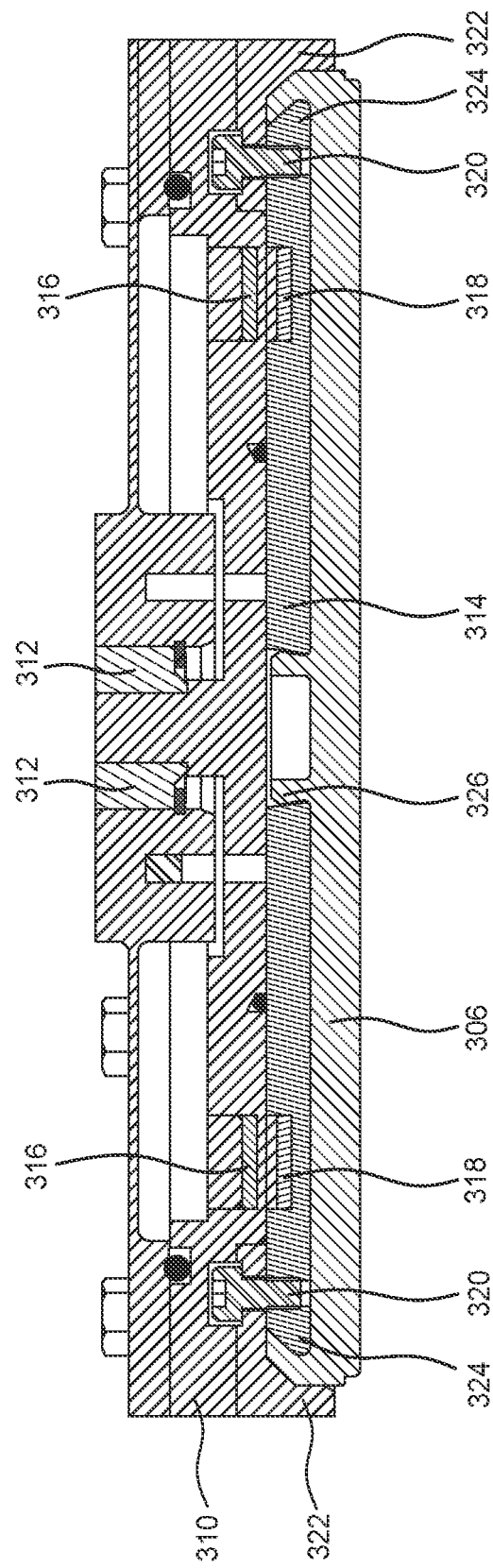
FIG. 4A is a side sectional view of an exemplary a gimbal base and a pad carrier according to one or more embodiments.

FIG. 4A is a side sectional view of an exemplary gimbal base 310 and a pad carrier 314 which may be used in the pad carrier assembly 304 of FIG. 3C. In some embodiments, the gimbal base 310 includes magnets 316 and the pad carrier 314 includes magnets 318 such that the gimbal base 310 and the pad carrier 314 are coupled via magnetic force. The gimbal base 310 and the pad carrier 314 are aligned via locating pins 320.

In some embodiments, the buffing pad 306 is formed of polyvinyl alcohol (PVA) material. PVA material is hydrophilic, and can absorb and retain water. When wet, PVA material is elastic, flexible, and soft, having mechanical strength and abrasion resistance. Compared to conventional material used as a buffing pad, such as poromeric material or filled or unfilled polymer material, PVA material provides high shear force for chemical and mechanical cleaning. The buffing pad 306 formed of PVA material has a diameter of about 134 mm, which is larger than a diameter of a typical buffing pad formed of conventional material, having a diameter about 67 mm. A larger buffing pad improves performance and reduces buffing time in chemical mechanical cleaning. Furthermore, a buffing pad 306 formed of PVA material is thicker than a typical buffing pad formed of conventional material. The pad carrier 314 is designed to support a large and thick water absorbent buffing pad 306 while preventing the buffing pad 306 from sagging by a mechanical clamping mechanism and a suction clamping mechanism.

The gimbal base 310 further includes a lip portion 322 on a peripheral edge of the gimbal base 310. The pad carrier 314 includes a tapered portion 324 on a peripheral edge of the pad carrier 314, tapering from a bottom surface towards a top surface of the pad carrier 314 facing the gimbal base 310, such that the tapered portion 324 is substantially parallel to an inner surface of the lip portion 322 of the gimbal base 310. The lip portion 322 of the gimbal base 310 and the tapered portion 324 of the pad carrier 314 together mechanically clamp the buffing pad 306 along a peripheral edge of the buffing pad 306. The pad carrier 314 has a diameter of about 128 mm on the bottom surface, and thickness of about 4.2 mm. A diameter of the pad carrier 314 on the top surface is smaller than the diameter of the pad carrier 314 by about 4.6 mm.

Figure 4B:
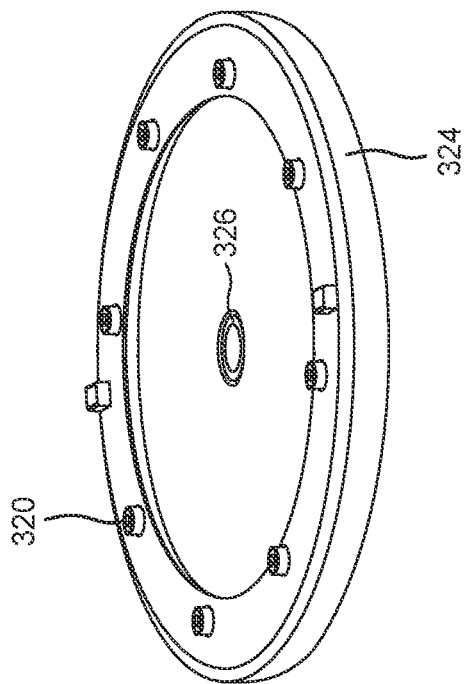
FIGS. 4B and 4C are a plan view and a side sectional view of a pad carrier according to one or more embodiments.
Figure 4C:
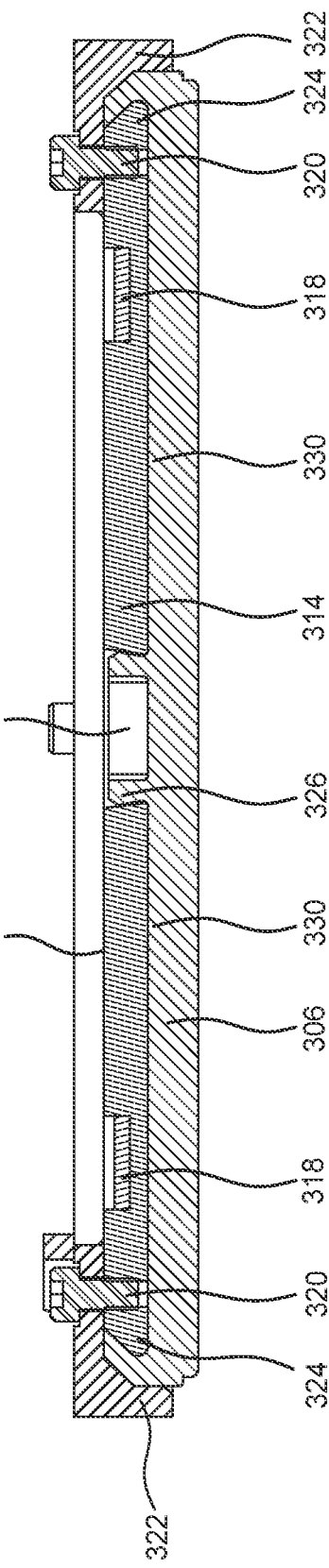

FIGS. 4B and 4C are a plan view and a side sectional view of the pad carrier 314 according to a first embodiment. In FIG. 4C, a portion of the gimbal base 310 and the buffing pad 306 are also shown. The pad carrier 314 includes a central slot 326 through which a rod 328 is pushed into the buffing pad 306. The slot 326 is circular shaped with a diameter of about 15 mm, and negatively tapered from a surface facing the gimbal base 310 towards a surface facing the buffing pad 306 (i.e., a diameter at the surface facing the gimbal base 310 is larger than a diameter at the surface basing the buffing pad 306). The rod 328 is cylindrically shaped with a diameter slightly larger than the diameter of the slot 326 such that the rod 328 is compressed when inserted into the slot 326. The rod 328, the pad carrier 314, and the buffing pad 306 are sealed among one another other and create a lower pressure region inside therein as compared to atmospheric air pressure outside. The atmospheric air pressure presses on the lower pressure region surrounded by the rod 328, the pad carrier 314, and the buffing pad 306 and creates suction clamping force for the buffing pad 306. The gimbal base 310 and the pad carrier 314 may be formed of a plastic or polymer, such as polyether ether ketone (PEEK). With the mechanical clamping mechanism by the lip portion 322 of the gimbal base 310 and the peripheral edge of the pad carrier 314, and the suction clamping mechanism by the rod 328 and the buffing pad 306, the buffing pad 306 can be supported by the pad carrier 314 securely. In FIGS. 4B and 4C, one circular slot 326 and one cylindrical rod 328 are illustrated. However, the pad carrier 314 may have multiple slots 326, each of which receives one rod 328, to create more suction clamping force to the buffing pad 306. The rod 328 may be of any shape and the slot has a shape that matches the shape of the rod 328 such that the rod 328 and the pad carrier 314 create low pressure inside therein.

Figure 4D:
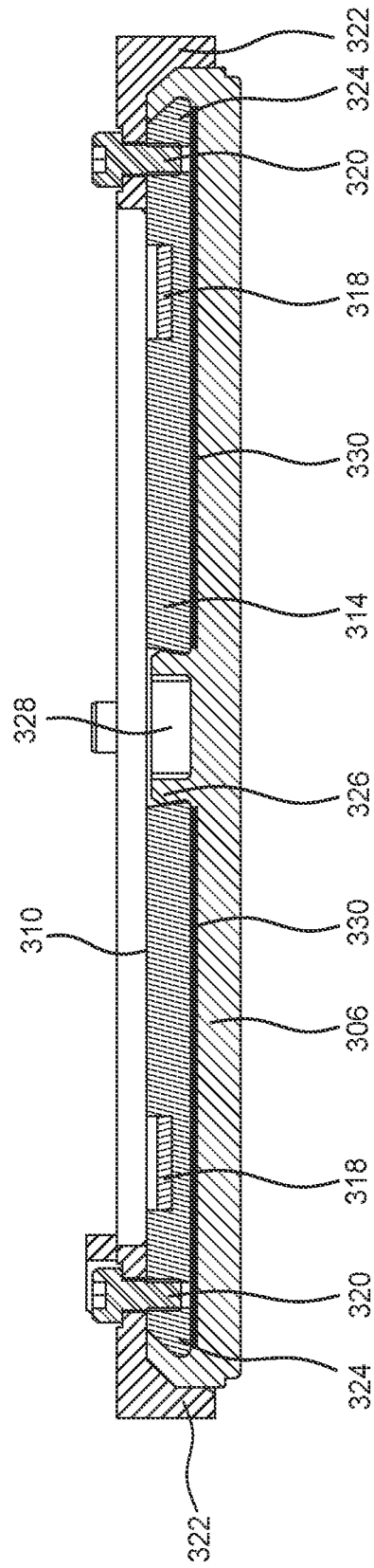
FIG. 4D is a side sectional view of a pad carrier according to one or more embodiments.

FIG. 4D is a side sectional view of the pad carrier 314 according to a second embodiment. In FIG. 4D, a portion of the gimbal base 310 and the buffing pad 306 are also shown. The pad carrier 314 includes a central slot 326 through which a rod 328 is pushed into the buffing pad 306, as in the first embodiment shown in FIG. 4C. In the second embodiment, a backing 330 that is in contact with the buffing pad 306 is disposed on a surface of the pad carrier 314. The backing 330 may be formed of plastic and adds stiffness to the buffing pad 306, further preventing the buffing pad 306 from sagging.

Figure 4F:
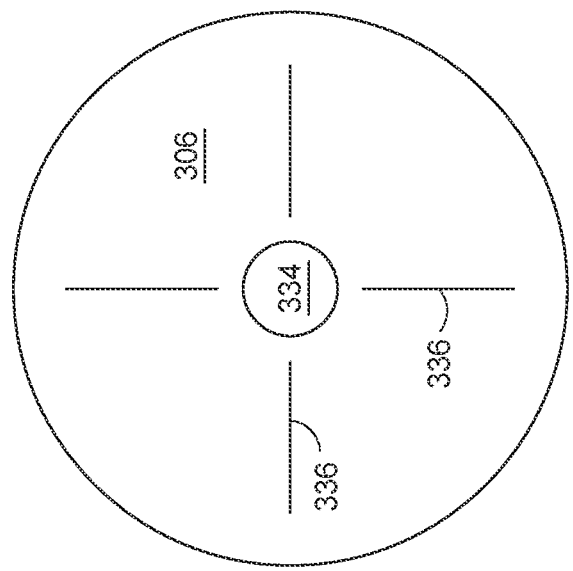
FIGS. 4E and 4F are top views of a buffing pad according to one or more embodiments.
Figure 4E:
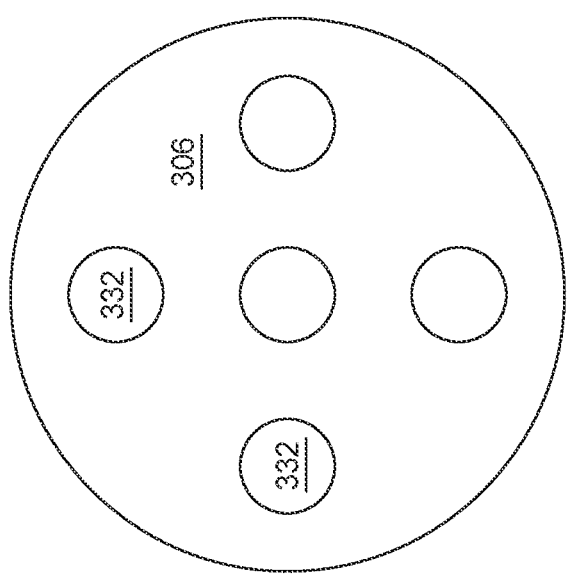

FIGS. 4E and 4F are top views of the buffing pad 306 according to a third embodiment. In the third embodiment, the buffing pad 306 has raised contact features formed on a surface of the buffing pad 306 facing the pad carrier 314, and the pad carrier 314 has multiple slots 326, in each of which one of the contact features engages. The raised contact features of the buffing pad 306 and the pad carrier 314 are sealed against each other and create a lower pressure region inside therein as compared to atmospheric air pressure outside, creating suction clamping force to the buffing pad 306. In FIG. 4E, the raised contact features are multiple pillars 332 and each of the pillars 332 engages in one slot 326 of the pad carrier 314. In FIG. 4F, the contact features include a pillar 334 that engages in a circle slot 326 that matches the shape of the pillar 334 and radial spokes 336 each of which engages in a rectangular slot 326 that matches the shape of the radial spokes 336.

In the embodiments described herein, pad carriers that support a large and thick water absorbent buffing pad, such as a buffing pad formed of polyvinyl alcohol (PVA) material, while preventing the buffing pad from sagging by a mechanical clamping mechanism and a suction clamping mechanism in chemical mechanical cleaning. A buffing pad formed of polyvinyl alcohol (PVA) material provides high shear force for chemical and mechanical polishing due to mechanical strength and abrasion resistance. A large sized buffing pad provides improved cleaning performance.

While the foregoing is directed to embodiments of the present disclosure, other and further embodiments of the disclosure may be devised without departing from the basic scope thereof, and the scope thereof is determined by the claims that follow.

The invention claimed is:

1. A horizontal pre-clean module, comprising:
   a chamber comprising a basin and a lid which collectively define a processing area;
   a rotatable vacuum table disposed in the processing area, the rotatable vacuum table comprising a substrate receiving surface;
   a pad conditioning station disposed proximate to the rotatable vacuum table;
   a pad carrier positioning arm having a first end and a second end distal from the first end;
   a pad carrier assembly coupled to the first end of the pad carrier positioning arm; and
   an actuator coupled to the second end of the pad carrier positioning arm and configured to swing the pad carrier assembly between a first position over the rotatable vacuum table and a second position over the pad conditioning station, wherein:
   the pad carrier assembly comprises a gimbal base and a pad carrier coupled to the gimbal base, the gimbal base and the pad carrier are configured to support a buffing pad by a mechanical clamping mechanism and a suction clamping mechanism,
   the gimbal base comprises a lip portion on a peripheral edge of the gimbal base,
   the pad carrier comprises a tapered portion on a peripheral edge of the pad carrier, and
   the lip portion and the pad carrier are configured to provide the mechanical clamping mechanism by mechanically clamping the buffing pad along a peripheral edge of the buffing pad.

2. The horizontal pre-clean module of claim 1, wherein:
   the gimbal base comprises magnets,
   the pad carrier comprises magnets, and
   the gimbal base and the pad carrier are coupled via magnetic force.

3. The horizontal pre-clean module of claim 1, wherein the pad carrier has a slot that receives a rod configured to be pushed into the buffing pad supported by the pad carrier, to provide the suction clamping mechanism to the buffing pad.

4. The horizontal pre-clean module of claim 1, wherein the pad carrier comprises a plastic backing that is in contact with the buffing pad supported by the pad carrier, to provide stiffness to the buffing pad.

5. The horizontal pre-clean module of claim 1, wherein the pad carrier has a plurality of slots that receive raised features formed on a surface of the buffing pad supported by the pad carrier, to provide the suction clamping mechanism to the buffing pad.

6. A pad carrier assembly for use in a horizontal pre-clean module, comprising:
   a gimbal base; and
   a pad carrier coupled to the gimbal base, wherein:

the gimbal base and the pad carrier are configured to support a buffing pad by a mechanical clamping mechanism and a suction clamping mechanism, the gimbal base comprises a lip portion on a peripheral edge of the gimbal base, the pad carrier comprises a tapered portion on a peripheral edge of the pad carrier, and the lip portion and the pad carrier are configured to provide the mechanical clamping mechanism by mechanically clamping the buffing pad along a peripheral edge of the buffing pad.

7. The pad carrier assembly of claim 6, wherein:

the gimbal base comprises magnets, the pad carrier comprises magnets, and the gimbal base and the pad carrier are coupled via magnetic force.

8. The pad carrier assembly of claim 6, wherein the pad carrier has a slot that receives a rod configured to be pushed into the buffing pad supported by the pad carrier, to provide the suction clamping mechanism to the buffing pad.

9. The pad carrier assembly of claim 6, wherein the pad carrier comprises a plastic backing that is in contact with the buffing pad supported by the pad carrier, to provide stiffness to the buffing pad.

10. The pad carrier assembly of claim 6, wherein the pad carrier has a plurality of slots that receive raised features formed on a surface of the buffing pad supported by the pad carrier, to provide the suction clamping mechanism to the buffing pad.

11. A method of supporting a buffing pad in a horizontal pre-clean module, comprising:

mechanically clamping a buffing pad along a peripheral edge of the buffing pad by a lip portion of a gimbal base and a tapered portion of a pad carrier, wherein:

the lip portion of the gimbal base is disposed on a peripheral edge of the gimbal base, and the tapered portion of the pad carrier is disposed on a peripheral edge of the pad carrier, and the gimbal base and the pad carrier are coupled and disposed in a horizontal pre-clean module; and supporting the buffing pad and preventing the buffing pad from sagging, by a suction clamping mechanism.

12. The method of claim 11, wherein the buffing pad comprises polyvinyl alcohol (PVA) material.

13. The method of claim 11, wherein the suction clamping mechanism comprises a rod pushed into the buffing pad through a slot of the pad carrier.

14. The method of claim 11, further comprising disposing a plastic backing to a surface of the pad carrier, the plastic backing being in contact with the buffing pad.

15. The method of claim 11, wherein the suction clamping mechanism comprises a plurality of slots and raised features formed on a surface of the buffing pad, the plurality of slots each receives one of the raised features.

* * * * *